United States Patent [19]
Degani et al.

[11] Patent Number: 5,778,913
[45] Date of Patent: Jul. 14, 1998

[54] CLEANING SOLDER-BONDED FLIP-CHIP ASSEMBLIES

[75] Inventors: Yinon Degani, Highland Park; Thomas Dixon Dudderar, Chatham; Dean Paul Kossives, Glen Gardner, all of N.J.

[73] Assignee: Lucent Technologies Inc., Murray Hill, N.J.

[21] Appl. No.: 803,474

[22] Filed: Feb. 20, 1997

[51] Int. Cl.[6] ........................................... B08B 3/02
[52] U.S. Cl. ................................. 134/153; 134/902
[58] Field of Search ..................... 134/902, 33, 153; 118/52; 156/345 L, 345 LS

[56] References Cited

U.S. PATENT DOCUMENTS 4,021,278  5/1977  Hood et al. ................. 134/902 X
5,489,341  2/1996  Bergman et al. ............... 134/33 X

FOREIGN PATENT DOCUMENTS 110674  7/1982  Japan ..................... 156/345 L
25538   1/1989  Japan ..................... 134/902
164036  6/1989  Japan ..................... 134/902

Primary Examiner—Philip R. Coe
Attorney, Agent, or Firm—John T. Rehberg

[57] ABSTRACT

Cleaning of a micromimiature high-density flip-chip assembly is carried out by spinning the assembly while applying cleaning fluid to a central portion of the assembly. Confinement of the cleaning fluid to a critical interconnection space of the assembly is ensured by a centrally apertured cover that resiliently engages the top of the assembly. During spinning, cleaning fluid is introduced through the aperture in the cover and is directed into and confined to flow radially in the interconnection space.

7 Claims, 2 Drawing Sheets

5,778,913

1

CLEANING SOLDER-BONDED FLIP-CHIP ASSEMBLIES

BACKGROUND OF THE INVENTION

This invention relates to electronic-component assemblies and, more particularly, to cleaning solder-bonded flip-chip assemblies.

So-called flip-chip assemblies are widely used as components in electronic equipment. A conventional flip-chip assembly comprises one or more individual semiconductor chips face-down solder-bonded to the surface of a supporting substrate. In a typical microminiature flip-chip assembly, multiple closely spaced chips each including a high density of connection points are attached by soldering to corresponding points on the surface of the substrate. In an illustrative such assembly, the lower or soldered faces of the chips may be positioned exceedingly close to the surface of the substrate.

To facilitate soldering of flip-chip assemblies, it is common practice to employ a conventional flux material during the soldering operation. But such fluxes commonly leave behind a residue that may deleteriously affect the assembled equipment. Hence, it is usually considered essential that such residues, as well as any stray bits of material such as solder, be removed from the assembly during its manufacture.

One way of removing flux residue and other material from a flip-chip assembly is to place the assembly on a conventional spinning table while directing a cleaning fluid onto a center region of the assembly, as is done in cleaning entire wafers of integrated circuits. The cleaning fluid is intended to work its way into the space between the chips and the surface of the supporting substrate of the assembly. In turn, the cleaning fluid flows radially outward in that space under the influence of centrifugal force. In that way, in time the indicated space is cleaned of flux residue and other extraneous matter.

But, in practice, as the density of solder connections in the indicated chip-to-substrate space of a flip-chip assembly increases and as the height of that space decreases, it has been found increasingly time consuming, or even impossible, to achieve a desired flow of cleaning fluid in the confined chip-to-substrate space. Introduced fluid tends instead to flow over the tops (unsoldered sides) of the chips. As a result, cleaning of some microminiature flip-chip assemblies by conventional spinning measures becomes extremely difficult. And, without the availability of an effective and economical cleaning technique, the manufacture of high-quality such assemblies is problematical.

Accordingly, continuing efforts have been directed by workers skilled in the art aimed at trying to solve the noted problem of cleaning dense solder-bonded flip-chip assemblies. It was recognized that such efforts, if successful, would increase the yield and decrease the cost of making high-reliability such assemblies.

SUMMARY OF THE INVENTION

In accordance with the principles of the present invention, a flip-chip assembly to be cleaned is placed substrate-side-down on a conventional spinning table. A centrally apertured cover having a correspondingly apertured compliant gasket on its underside is placed in contact with the tops of the chips of the assembly. Cleaning fluid is then introduced through the aperture in the cover and gasket to impinge on a central exposed chip-free surface portion of the substrate. Due to centrifugal force, the introduced fluid is drawn radially from the central portion of the spinning substrate toward the outer edges thereof. At the same time, the gasket effectively confines the flow of fluid to the space between the bottom of the chips and the top surface of the substrate, which constitutes the critical interconnection space to be cleaned.

BRIEF DESCRIPTION OF THE DRAWING

A complete understanding of the present invention and of the above and other features and advantages thereof may be gained from a consideration of the following detailed description presented hereinbelow in connection with the accompanying drawing, not drawn to scale, in which.

DETAILED DESCRIPTION

The principles of the present invention are applicable to cleaning a wide variety of flip-chip assemblies. Herein, for purposes only of a specific illustrative example, emphasis will be directed to cleaning an assembly that comprises a supporting substrate to which multiple integrated-circuit semiconductor chips have been face-down bonded by standard soldering techniques.

Figure 1:
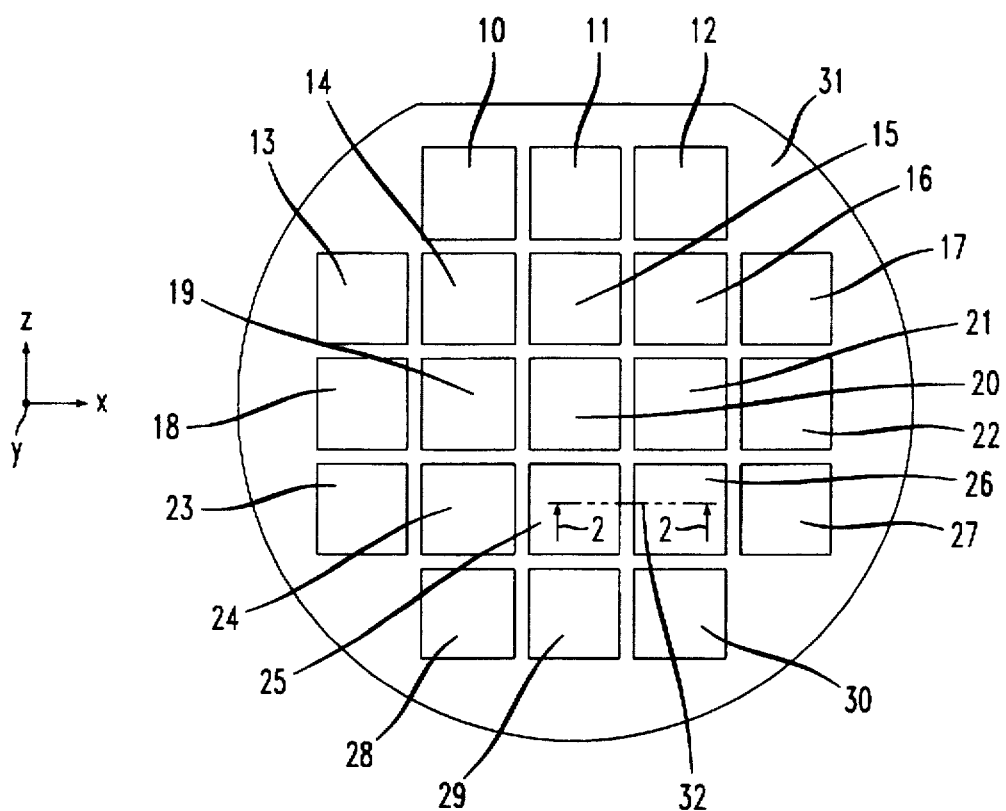
FIG. 1 is a schematic showing of a top view of an illustrative flip-chip assembly of a type known in the art.

FIG. 1 shows such an illustrative flip-chip assembly. As depicted, chips 10 through 30 are attached face-down to the top surface of a substrate 31. By way of a particular example, the substrate 31 is assumed to comprise a conventional wafer made of silicon. In some cases, where the wafer 31 has an X-direction diameter of about fifteen centimeters (cm), as many as 108 chips, each having X-and Z-direction dimensions of approximately 0.4 cm, may be mounted on the surface of the wafer in close proximity to each other. Of course, the chips on the wafer 31 need not all be of the same size or have the same Y-direction thickness.

In some cases, the complete overall assembly represented in FIG. 1 will be used intact as a component part in a piece of electronic equipment. In other cases, the depicted assembly will, before actual use, be divided into subassemblies by sawing the indicated wafer into component parts each containing one or more face-down solder-bonded chips. In any case, to ensure reliable operation, cleaning of the solder-bonded component parts is required before they are connected into equipment.

As the trend toward microminiaturization and dense packing continues, reliable and economical cleaning of a flip-chip assembly of the type represented in FIG. 1 becomes increasingly difficult. This is so because it becomes exceedingly hard for cleaning fluid to enter and circulate freely throughout the space between the bottom surfaces of the chips and the top surface of the wafer 31 shown in FIG. 1.

Figure 2:
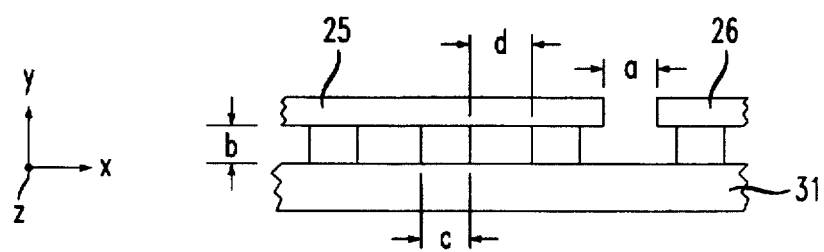
FIG. 2 is a side view in cross-section of a portion of the FIG. 1 assembly.

This difficulty is illustrated with the aid of FIG. 2 which shows in crosssection a portion of the flip-chip assembly of FIG. 1. In particular, FIG. 2 is a cross-sectional depiction of portions of the mounted chips 25 and 26 of FIG. 1 as viewed at reference line 32 in the direction of arrows 2 of FIG. 1. By way of example, the Y-direction thickness of the chips will generally vary between about ten and twenty times the chip-to-wafer distance.

In some illustrative flip-chip assemblies, the X-direction separation a between adjacent edges of the chips 25 and 26 of FIG. 2 may be as small as twenty-five micrometers (pm). Further, by way of example, the Y-direction chip-to-wafer distance b is only approximately 150 µm. Also, each chip may contain a multitude of individual solder joints each having an X-direction diameter c of about 150 µm and a joint-to-joint spacing d of only approximately 300 µm or less. Accordingly, for chips whose X and Z dimensions are several thousands of times larger than the chip-to-wafer separation, it is apparent that it is difficult even for low-viscosity cleaning fluid to enter the space between the chips 25 and 26 (FIG. 2) and to circulate in the congested chip-to-wafer interconnection space One way of cleaning a conventional solder-bonded assembly of the type represented in FIGS. 1 and 2 is to place the assembly, wafer-side down, on a standard spinning table and to introduce cleaning fluid onto the tops (unsoldered sides) of the indicated chips at or near the center of the spinning assembly. In some assemblies, the introduced fluid is able to find its way into the interconnection space between the chips and the wafer surface and to circulate relatively freely outward through that space under the influence of centrifugal force, thereby achieving an effective cleaning action.

In extremely dense solder-bonded assemblies, however, it is often found in practice to be difficult, if not impossible, to clean the interconnection space by utilizing standard spinning techniques. Any cleaning fluid applied to such an assembly tends to flow over the tops of the chips rather than in the indicated space.

In accordance with the principles of the present invention, a conventional spinning table is modified such that the flow of cleaning fluid applied to the center of a microminiature flip-chip assembly mounted on the table is effectively confined to the chip-to-wafer space of the assembly. A specific illustrative apparatus that embodies such principles is represented in FIG. 3, which, as mentioned above, is not drawn to scale.

Figure 3:
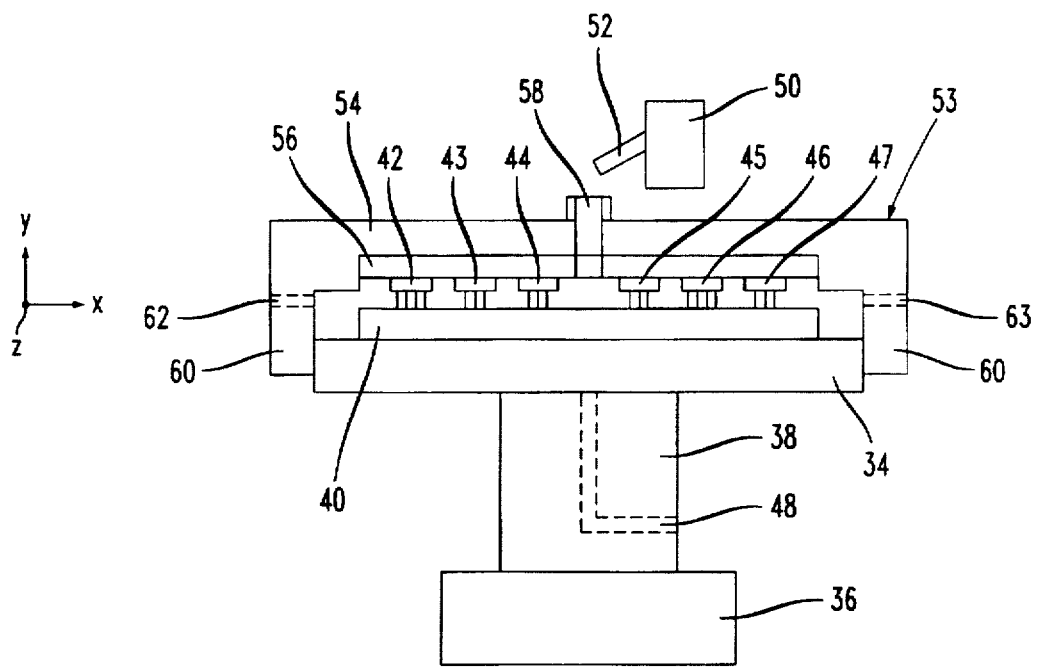
FIG. 3 is a simplified side view partially in cross-section of a specific illustrative cleaning apparatus made in accordance with the principles of the present invention.

FIG. 3 shows a conventional spinning assembly comprising a table or chuck 34 connected to a motor 36 via a drive shaft 38. Illustratively, the table 34 is designed to be thereby rotated about a Y-direction axis at a speed of about 3000-to-6000 revolutions per minute. An exemplary flip-chip assembly to be cleaned, comprising a wafer 40 and chips 42 through 47, is shown mounted on the planar top surface of the table 34. By way of example, the depicted flip-chip assembly is maintained in contact with the table 34 during spinning by conventional vacuum-chucking techniques, as schematically represented in FIG. 3 by dash-line channel 48.

The table 34 shown in FIG. 3 is, for example, circular in cross-section in a plane parallel to the indicated X–Z plane and has a diameter slightly greater than that of the wafer 40. Advantageously, to facilitate the introduction of cleaning fluid into the chip-to-wafer space, the wafer includes a central area in which no chip is mounted.

The apparatus represented in FIG. 3 also includes a reservoir 50 for storing fluid to be used to clean the flip-chip assembly mounted on the table 34. In turn, cleaning fluid is applied to the flip-chip assembly from the reservoir 50 via a delivery tube 52.

In accordance with the principles of the present invention, the conventional apparatus shown in FIG. 3 and described above further includes a cover assembly 53 that comprises a plate member 54 and a compliant gasket 56. The particular illustrative member 54, which, for example, is made of a metal or plastic that is not deleteriously affected by the particular fluid to be used to clean the indicated flip-chip assembly, is roughly shaped like an inverted cylindrical cup. The upper portion of the member 54 (that is, the bottom of the cup-like shape) includes a centrally positioned aperture around which a hollow elongated spout 58 is formed. Cleaning fluid from the reservoir 50 is directed by the tube 52 into the top of the spout 58.

Additionally, the side of the plate member 54 of FIG. 3 comprises a cylindrical flange 60 that abuts the side of the table 34 and maintains the member 54 in alignment with the rest of the depicted apparatus. Apertures 62 and 63 in the flange 60 allow cleaning fluid applied to the flip-chip assembly to flow out of the indicated apparatus and, if desired, to be filtered and recirculated for further use.

The aforementioned gasket 56 shown in FIG. 3 is made of a compliant material which is impervious to the particular fluid to be used to clean the flip-chip assembly. In one specific illustrative case in which a conventional cleaning fluid such as terpene is utilized to clean the assembly, the gasket is made of silicone. By way of example, the gasket 56 is cemented to a bottom surface of the plate member 54, thereby becoming an integral constituent of the indicated cover assembly.

In the particular design represented in FIG. 3, the gasket 56 comprises a cylindrical member having a centrally located aperture. As indicated, the aperture in the gasket 56 is aligned with the hollow spout 58 and the aforementioned opening in the plate member 54.

With the cover assembly 53 resting on the flip-chip assembly as shown in FIG. 3, the compliant gasket 56 blocks cleaning fluid introduced into the spout 58 from flowing over the tops of the chips 42 through 47. And, because, as mentioned earlier above, a flip-chip assembly to be cleaned in the depicted apparatus is advantageously designed to include a centrally located chip-free area which is in registry with the spout 58, introduced cleaning fluid has ready access to enter the space between the chips and the top surface of the wafer 40. In that way, cleaning fluid is applied and confined to the critical chip-to-wafer space to be cleaned. And, due to centrifugal effects, the confined fluid is drawn radially through that space with considerable sucking force to achieve an effective cleaning action therein. Consequently, even dense microminiature interconnection spaces can be reliably and consistently cleaned in a relatively short period of time.

During spinning of the apparatus shown in FIG. 3, the elongated spout 58 serves in effect as a reservoir to hold a supply of cleaning fluid. During the cleaning process, as the interconnection space is gradually cleared of residue and debris, the flow of fluid through the interconnection space increases and the fluid level in the spout 58 correspondingly tends to decrease. When that occurs, it is advantageous, either by manual or straightforward automatic techniques, to increase the flow from the reservoir 50 into the spout 58, thereby to maintain in the spout a relatively constant level or at least a level above a predetermined minimum. An adequate available supply of cleaning fluid for introduction into the interconnection space is thereby assured.

Figure 4:
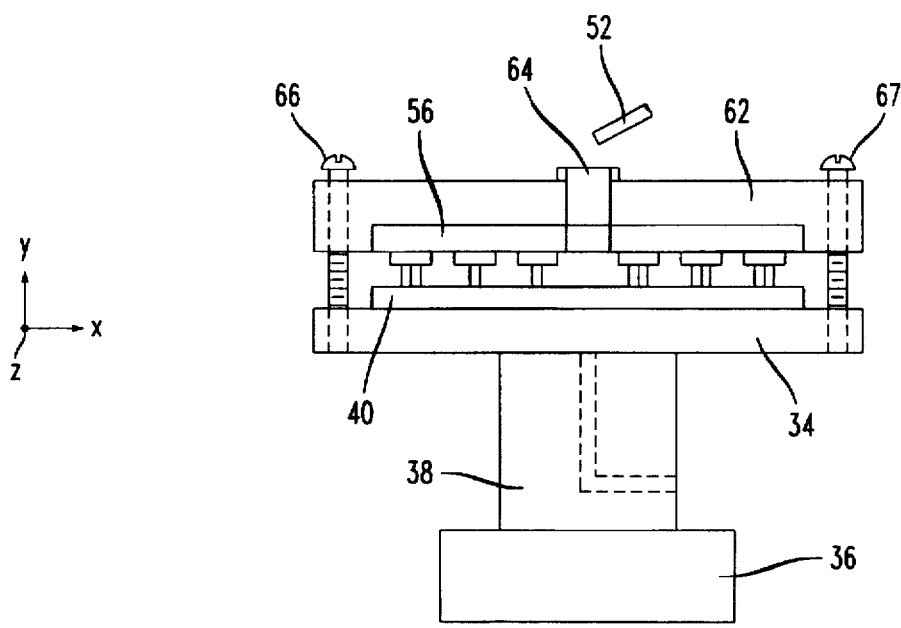
FIG. 4 shows a particular variation of the inventive apparatus represented in FIG. 3.

In accordance with the principles of the present invention, numerous variants of the specific illustrative apparatus represented in FIG. 3 are feasible. Thus, for example, the cover assembly 53 of FIG. 3 may be modified to the form shown in FIG. 4 to comprise simply a cylindrically shaped flat plate 62 having a centrally located spout 64 and a lower indented portion in which the aforedescribed compliant gasket 56 is retained. Unlike the cover assembly 53 of FIG. 3, the plate 62 of FIG. 4 does not include a side portion such as the flange 60 of FIG. 1 3. Instead, the plate 62 of FIG. 4 is, for example, aligned and maintained in place on the table 34 by three adjustable screws, two of which (designated by reference numerals 66 and 67) are shown in FIG. 4. The stand-off or distance between the plate 62 and the table 34 is controlled by adjusting the indicated screws. In that way, the force with which the gasket 56 presses down on the tops of the chips mounted on the wafer 40 can be easily adjusted, thereby to ensure that, even with a flip-chip assembly containing chips of different thicknesses, a tight chip-to-gasket seal will be realized and cleaning fluid will be effectively blocked from flowing over the tops of the chips.

Alternatively, the plate 62 of FIG. 4 with its associated gasket 56 could simply rest on the tops of the indicated chips and be aligned in place by three 120-degree-displaced pins secured in the plate 62. Such pins (not shown) could lie outboard of and rest against the sides of the table 34. Or such pins could be stepped and designed to rest both against the sides of and on top of the table 34, thereby accurately determining the amount of stand-off of the plate 62 with respect to the table. In another illustrative embodiment, straight pins extending from the plate 62 could be positioned to fit in aligned holes formed in the top surface of the table 34.

Finally, it is to be understood that the above-described arrangements and techniques are only illustrative of the principles of the present invention. In accordance with these principles, numerous other modifications and alternatives may be devised by those skilled in the art without departing from the spirit and scope of the invention.

What is claimed is:

1. Apparatus for cleaning a flip-chip assembly that includes at least one chip that is face-down solder-bonded to a supporting substrate, said apparatus comprising
   a table adapted to hold the assembly substrate-side-down,
   means for rotating said table,
   a cover, having a centrally positioned aperture, adapted to resiliently engage the top of the assembly to be cleaned,
   and means for introducing cleaning fluid via said aperture into the chip-to-substrate space of the assembly to be cleaned.

2. Apparatus as in claim 1 wherein said cover includes a compliant gasket having a centrally positioned aperture.

3. Apparatus as in claim 2 further including means for forcing said gasket to resiliently engage the top of said assembly.

4. Apparatus as in claim 3 wherein said means for forcing comprises an apertured cover on the top side of said gasket.

5. Apparatus as in claim 4 wherein said means for forcing further comprises means for adjusting the distance between said cover plate and the surface of said table thereby controlling the force with which the gasket engages the top of said assembly.

6. Apparatus as in claim 4 wherein said gasket comprises silicone.

7. Apparatus as in claim 6 wherein said means for introducing comprises a spout reservoir formed integrally with said cover and disposed about the centrally positioned aperture therein.

* * * * *